United States Patent
Herzogenrath et al.

(10) Patent No.: US 10,794,928 B2
(45) Date of Patent: Oct. 6, 2020

(54) MICROELECTROMECHANICAL COMPONENT

(71) Applicant: Robert Bosch GmbH, Stuttgart (DE)

(72) Inventors: Benny Pekka Herzogenrath, Wuppertal (DE); Denis Gugel, Dusslingen (DE); Rolf Scheben, Reutlingen (DE); Rudy Eid, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/975,294

(22) Filed: May 9, 2018

(65) Prior Publication Data

US 2018/0334381 A1    Nov. 22, 2018

(30) Foreign Application Priority Data

May 18, 2017    (DE) .......................... 10 2017 208 357

(51) Int. Cl.
     *G01P 15/08*      (2006.01)
     *B81B 3/00*      (2006.01)

(52) U.S. Cl.
CPC .............. *G01P 15/08* (2013.01); *B81B 3/001* (2013.01); *B81B 3/0013* (2013.01); *B81B 3/0035* (2013.01); *B81B 3/0051* (2013.01); *B81B 2201/0235* (2013.01); *B81B 2201/0242* (2013.01); *B81B 2203/019* (2013.01); *B81B 2203/0127* (2013.01); *B81B 2203/0361* (2013.01); *B81B 2203/0392* (2013.01); *B81B 2203/053* (2013.01); *G01P 2015/0862* (2013.01); *G01P 2015/0871* (2013.01)

(58) Field of Classification Search
CPC ... B81B 3/0051; B81B 3/0035; B81B 3/0013; B81B 3/001; B81B 2203/0361; B81B 2203/0127; B81B 2203/053; B81B 2203/019; B81B 2203/0392; B81B 2201/0242; B81B 2201/0235; G01P 2015/0871
See application file for complete search history.

(56) References Cited

U.S. PATENT DOCUMENTS

| | | | | |
|---|---|---|---|---|
| 6,065,341 | A * | 5/2000 | Ishio | ..................... B81B 3/0051 361/283.3 |
| 6,863,595 | B1 * | 3/2005 | Zagrebelny | ......... B24B 37/0056 257/E21.244 |
| 8,973,438 | B2 * | 3/2015 | Kim | ................... G01C 19/5755 73/493 |

(Continued)

FOREIGN PATENT DOCUMENTS

| | | |
|---|---|---|
| DE | 19906046 A1 | 8/1999 |
| EP | 2860990 A1 | 4/2015 |

*Primary Examiner* — Charles D Garber
*Assistant Examiner* — S M Sohel Imtiaz
(74) *Attorney, Agent, or Firm* — Norton Rose Fulbright US LLP; Gerard Messina

(57) ABSTRACT

A microelectromechanical component including, vertically at a distance from one another, a substrate device, a first, a second, and a third functional layer, a vertical stop being formed between the second and third functional layer, the vertical stop having a stop area on a surface of the second functional layer facing the third functional layer, wherein the second functional layer is connected to the first functional layer in a connecting area allocated to the stop area.

5 Claims, 1 Drawing Sheet

(56) References Cited

U.S. PATENT DOCUMENTS

| | | | | |
|---|---|---|---|---|
| 9,206,032 B1* | 12/2015 | Kang | | B81B 7/0058 |
| 2003/0124786 A1* | 7/2003 | Yamaguchi | | G01P 15/125 |
| | | | | 438/200 |
| 2003/0173330 A1* | 9/2003 | Lutz | | B81C 1/00333 |
| | | | | 216/11 |
| 2004/0248344 A1* | 12/2004 | Partridge | | B81C 1/00333 |
| | | | | 438/127 |
| 2006/0169043 A1* | 8/2006 | McNeil | | G01P 15/125 |
| | | | | 73/514.01 |
| 2010/0072563 A1* | 3/2010 | Sato | | B81B 7/007 |
| | | | | 257/415 |
| 2010/0242600 A1* | 9/2010 | Lin | | G01P 15/125 |
| | | | | 73/504.12 |
| 2011/0048131 A1* | 3/2011 | Reinmuth | | B81B 3/0051 |
| | | | | 73/504.12 |
| 2013/0015743 A1* | 1/2013 | Tsai | | B81B 3/0005 |
| | | | | 310/300 |
| 2013/0167640 A1* | 7/2013 | Lim | | G01P 15/0802 |
| | | | | 73/514.01 |
| 2013/0299923 A1* | 11/2013 | Classen | | B81B 3/0018 |
| | | | | 257/415 |
| 2014/0311242 A1* | 10/2014 | Lee | | G01C 19/5783 |
| | | | | 73/504.12 |
| 2014/0345380 A1* | 11/2014 | Jia | | B81B 3/0016 |
| | | | | 73/514.32 |
| 2015/0001647 A1* | 1/2015 | Dehe | | B81B 3/0021 |
| | | | | 257/416 |
| 2015/0061049 A1* | 3/2015 | Weber | | G01L 1/148 |
| | | | | 257/417 |
| 2015/0131135 A1* | 5/2015 | Reinmuth | | G02B 26/0841 |
| | | | | 359/221.2 |
| 2015/0137283 A1* | 5/2015 | Liang | | B81B 7/02 |
| | | | | 257/415 |
| 2015/0143907 A1* | 5/2015 | Ullrich | | G01P 15/125 |
| | | | | 73/514.32 |
| 2016/0031698 A1* | 2/2016 | Steimle | | B81B 3/001 |
| | | | | 257/418 |
| 2016/0332863 A1* | 11/2016 | Cheng | | H01L 24/00 |
| 2017/0008758 A1* | 1/2017 | Chu | | B81C 1/00238 |
| 2017/0210614 A1* | 7/2017 | Cheng | | B81B 3/0008 |
| 2017/0341929 A1* | 11/2017 | Okumura | | B81C 1/00825 |

* cited by examiner

MICROELECTROMECHANICAL COMPONENT

CROSS REFERENCE

The present application claims the benefit under 35 U.S.C. § 119 of German Patent Application No. DE 102017208357.3 filed on May 18, 2017, which is expressly incorporated herein by reference in its entirety.

BACKGROUND INFORMATION

The present invention relates to a microelectromechanical component.

Microelectromechanical components are generally available. For example, microelectromechanical sensors (MEMS) are used to measure accelerations and rates of rotation in many applications. Such microelectromechanical sensors generally have a plurality of movable structures that are connected to the substrate of the sensor via springs. These movable structures can be situated in a functional layer between the substrate device and the cap device. However, during use of the MEMS sensors, in addition to the accelerations and rotational rates that are to be measured overload accelerations always also occur. For the prevention of damage to the MEMS sensor, in particular to the movable structures of the sensor, due to overload accelerations, various mechanical designs are available. For example, lateral movements can be limited by lateral stop nubs. The lateral stop nubs define fixed stop points in the region of which a movement of the movable structure does not cause damage to the MEMS sensor, and they limit the tensions that occur between the movable structure and its suspension due to overload accelerations. In order to limit vertical movement out of the functional layer, upper and lower stops are used. These are realized as stop nubs on the cap or on the substrate situated below the functional layer. Analogous to the lateral stops, the vertical stops limit the freedom of movement of the movable structure in the vertical direction, and define a stop point in order to prevent damage to the MEMS sensor. The use of the upper and lower vertical stops is possible only when no additional functional layer is situated between the movable structure that is to be secured and the cap device, or between the movable structure that is to be secured and the substrate device.

SUMMARY

It is an object of the present invention to provide a microelectromechanical component having a plurality of functional layers situated between the substrate device and the cap device, said component having increased robustness compared to the conventional microelectromechanical components.

In comparison to conventional components, the microelectromechanical component according to the present invention may have the advantage that vertical movements of a third functional layer downward are also limited by a vertical stop. In this way, damage to the microelectromechanical component due to vertical overload accelerations upward is prevented. In this way, a microelectromechanical component having a plurality of functional layers, in particular movable ones, is advantageously provided that is more robust in comparison with corresponding conventional components. Here, the spacing distance of the stop can be set via the distance between the second and third functional layer. The spacing distance of the stop is independent of the distance between the first and second functional layer. The spacing distance of the stop is thus determined solely by the geometry and topology of the third functional layer, and is thus optimally adapted to these. In the context of the present invention, the term "microelectromechanical component" is to be understood such that the term includes both micromechanical components and also microelectromechanical components.

Advantageous embodiments and development of the present invention are described herein with reference to the figures.

According to a preferred development of the present invention, it is provided that the stop area and the connecting area are at a distance from one another only vertically. Preferably, the stop area and the connecting area are situated on opposite-facing surfaces of the second functional layer. In particular, the stop area is situated on a surface of the second functional layer facing the third functional layer, and the connecting area is situated on a surface of the second functional layer facing the first functional layer. Preferably, the stop area and the connecting area have essentially identical dimensions. In this way, a stop for the third functional layer is defined on the first and second functional layers that are fixedly connected in the stop area. The independent functionalization and capacity of movement of the first and third functional layers is limited only within the very narrowly limited connecting area or stop area. The independent functionalizability of the first, second, and third functional layer is thus retained to the greatest possible extent, despite the stop.

According to a preferred development of the present invention, it is provided that the third functional layer has a nub in an area situated opposite the stop area. Preferably, the nub is realized on a surface of the third functional layer facing the second functional layer. The base surface of the nub preferably has the dimensions of the stop area. The nub can be realized through the processing of one or more oxide layers on the surface, facing the second functional layer, of the third functional layer deposited above it. Here, the thickness of the oxide layers deposited between the second and third functional layer determines the spacing distance of the vertical stop. Advantageously, in this way the spacing distance of the vertical stop can be matched to the geometry and topology of the third functional layer.

According to a preferred development of the present invention, it is provided that the second functional layer has a frame in the connecting area. According to a preferred development, it is provided that the first and the second functional layer are connected to one another via an oxide layer situated between the first and second functional layer in the connecting area. In particular, an oxide layer is deposited on the first functional layer. The oxide layer is preferably open in the area in which the connecting area of the second functional layer is to be created. The oxide via, produced in this way, in the form of a frame, is filled during the deposition of the second functional layer, and the oxide is enclosed inside the frame. The area surrounded by the oxide via of the second functional layer is fixedly connected to the first functional layer. In this way, a fixed vertical stop downward is advantageously provided for the third functional layer.

According to a preferred development, it is provided that the second functional layer has a nub in the stop area. In particular, the topography of the surface of the second functional layer facing the third functional layer is determined by the structure of the frame, in particular of the oxide via. Preferably, the surface of the second functional layer facing the third functional layer has a sink in the area of the frame. In this way, the area of the surface facing the third functional layer, situated over the interior of the frame, forms a nub. Here, preferably the thickness of the second functional layer in the area of the nub is essentially identical to the thickness of the second functional layer outside the stop area and connecting area. In this way, a fixed vertical stop is advantageously provided on the second functional layer that is completely mechanically decoupled from the rest of the second functional layer.

According to a preferred development, it is provided that the second and/or the third functional layer are movable relative to the substrate device. Preferably, the second and/or third functional layer have movable structures. The movable structures can be coupled among one another via spring structures, and/or can be connected to the substrate via spring structures. Preferably, the second and/or third functional layer are movable in the lateral and/or vertical direction.

According to a preferred development, it is provided that the microelectromechanical component has an acceleration sensor or a rotational rate sensor. In particular, the microelectromechanical component has a microelectromechanical sensor, preferably an inertial sensor.

Exemplary embodiments of the present invention are shown in the figures and are explained in more detail below.

DETAILED DESCRIPTION OF EXAMPLE EMBODIMENTS

Figure 1:
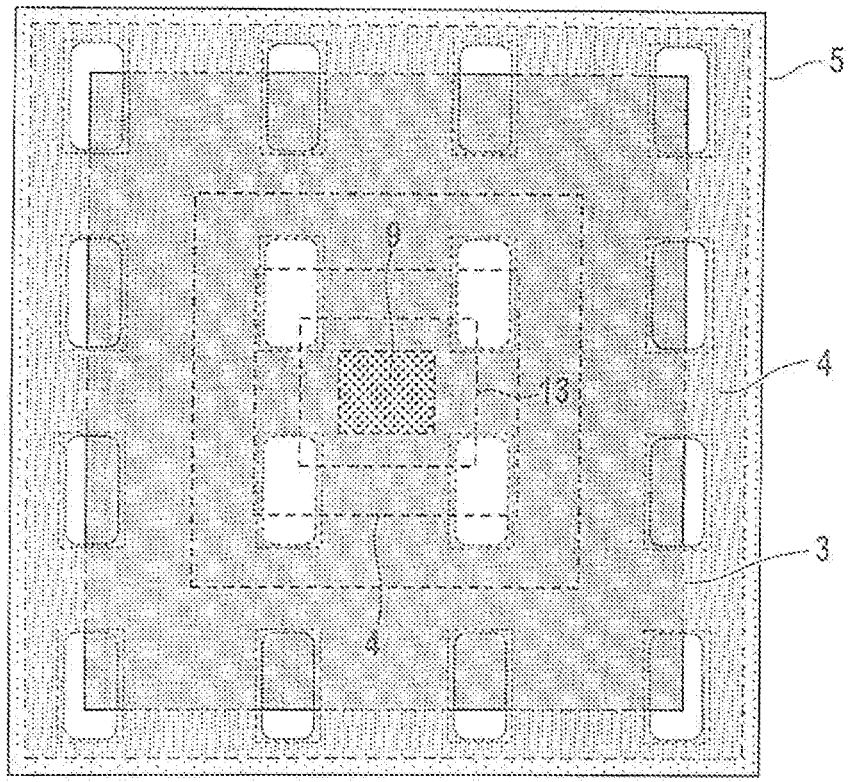
FIG. 1 shows a top view of a vertical stop of a microelectromechanical component according to a specific embodiment of the present invention, in a schematic view.

In the various Figures, identical parts are always provided with the same reference characters, and are therefore named or mentioned only once, as a rule.

Figure 2:
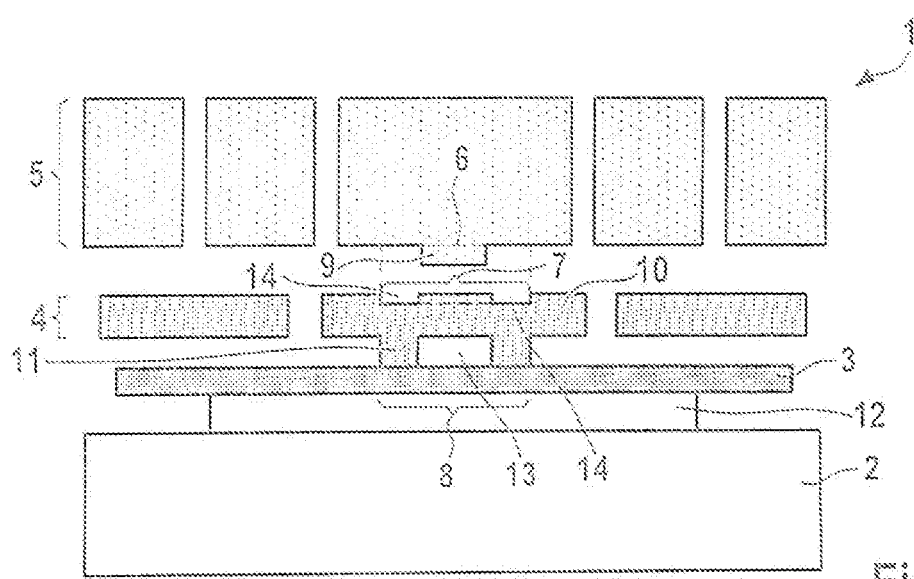
FIG. 2 shows a cross-section of a vertical stop of a microelectromechanical component according to a specific embodiment of the present invention, in a schematic view.

FIGS. 1 and 2 show a top view and a cross-section of a vertical stop 6 of a microelectromechanical component 1 according to a specific embodiment of the present invention, in a schematic view. In the area of the stop, microelectromechanical component 1, for example an inertial sensor, has a first, second, and third functional layer 3, 4, 5. Here, the first, second, and third functional layer 3, 4, 5 are vertically at a distance from one another, and are essentially situated one over the other on a substrate device 2, also called a substrate wafer. The first, second, and/or third functional layer can have a structuring. The first functional layer 3 is fixedly connected to substrate device 2. In particular, a first oxide layer 12 is deposited on substrate device 2. First functional layer 3 is processed on first oxide layer 12. Here, first functional layer 3 is fixedly connected to substrate device 2 via first oxide layer 12. A second oxide 13 is deposited on first functional layer 3. Over this, second and third functional layers 4, 5 are processed, with a vertical spacing from one another. Second and third functional layers 4, 5 have movable structures. The movable structures are coupled to one another and/or to substrate device 2, for example by springs. In particular, third functional layer 5 is movable in the vertical direction. In order to prevent damage to microelectromechanical component 1, a vertical stop 6 is realized between second and third functional layers 4, 5.

Vertical stop 6 limits the movement of third functional layer 5 upward and downward, and defines a contact point below third functional layer 5. In the limited frame of movement defined by this contact point, no damage to microelectromechanical component 1 takes place. The vertical stop has on the one hand a stop area 7 on the upper side, i.e., on a surface facing third functional layer 5, of second functional layer 4. Stop area 7 has a circumferential sink 14. Preferably, sink 14 encloses a surface whose dimensions correspond to the base surface of nub 9 of third functional layer 5. The surface enclosed by sink 14 forms a nub 10 on the upper side of second functional layer 4. In particular, the topography of the upper side of second functional layer 4 is determined by the structure of oxide layer 13 situated below second functional layer 4. Preferably, second oxide layer 13 is open in the area of vertical stop 6, so that an oxide via results in the shape of a frame. During the deposition of second functional layer 4, the oxide via is filled, and the oxide 13 situated inside frame 11 is enclosed. In this way, the topography of the upper side of second functional layer 4 is determined. In particular, the topography corresponds to the upper side of the frame structure of oxide layer 13. The region of second functional layer 4 enclosed by frame 11 is in this way connected fixedly to first functional layer 3. In this way, on second functional layer 4 there results a fixed stop area 7 for third functional layer 5. The actual function of second functional layer 4 is interrupted only by stop 6, and the mobility of second functional layer 4 is limited only in the narrowly limited area of stop 6.

Vertical stop 6 has a nub 9 processed on the lower side, i.e., on a surface facing second functional layer 4, of third functional layer 5. Nub 9 is preferably realized having a rectangular base surface. Here, the thickness of nub 9 determines the spacing distance of vertical stop 6. Nub 9 preferably results through processing and structuring of one or more oxide layers on the lower side of third functional layer 5 deposited above it. In this way, the spacing distance can advantageously be set in accordance with the requirements and dimensions of third functional layer 5. In particular, the spacing distance is independent of the geometries and the relative situation of first and second functional layers 4, 5.

Through the forming of stop 6 between second and third functional layers 4, 5, spacing distances can be realized as a function of the selected thicknesses of the oxide layers situated between second and third functional layers 4, 5. In this way, a vertical stop 6 is advantageously provided for a microelectromechanical component 1 having a plurality of movable functional layers. Vertical stop 6 protects, in particular, the third functional layer against vertical overload accelerations downward. In this way, damage to microelectromechanical component 1 due to overload accelerations is reduced. In this way, a microelectromechanical component 1 having increased robustness is advantageously provided.

What is claimed is:

1. A microelectromechanical component, comprising:
vertically at a distance from one another, a substrate device, a first functional layer, a second functional layer, and a third functional layer, a vertical stop being formed between the second functional layer and third functional layer, the vertical stop having a stop area on a surface of the second functional layer facing the third functional layer;
wherein the second functional layer is connected to the first functional layer in a connecting area located vertically adjacent to the stop area, wherein the vertical stop includes a nub on an upper surface of the second functional layer that projects vertically from the upper surface, wherein the vertical stop includes a nub on a lower surface of the third functional layer that projects vertically from the lower surface and toward the nub on the upper surface of the second functional layer, wherein the nub on the upper surface of the second functional layer and the nub on the lower surface of the third functional layer have respective cross-sectional shapes that are rectangular, the connecting area is an oxide connecting the first functional layer and the second functional layer, the oxide having a first oxide via and a second oxide via that form a frame in which the second functional layer is disposed, the frame encloses a portion of the oxide that projects from an upper surface of the first functional layer, a topography of the nub on the upper surface of the second functional layer corresponds to an upper side of the portion of the oxide enclosed by the frame, a horizontal width of the enclosed portion of the oxide is bounded by an inner vertical surface of the first via and by an inner vertical surface of the second via, and a horizontal width of the nub on the upper surface of the second functional layer is the same as and determined by the width of the enclosed portion of the oxide that is bounded by the inner vertical surfaces of the first and the second vias.

2. The microelectromechanical component as recited in claim 1,
wherein the stop area and the connecting area are at a distance from one another only vertically.

3. The microelectromechanical component as recited in claim 1,
wherein at least one of the second functional layer and the third functional layer are movable relative to the substrate device.

4. The microelectromechanical component as recited in claim 1,
wherein the microelectromechanical component has one of an acceleration sensor or a rotational rate sensor.

5. The microelectromechanical component as recited in claim 1,
wherein one of: (i) a fourth functional layer, or (ii) the fourth functional layer and a fifth functional layer, is situated above the third functional layer.

* * * * *